United States Patent
He et al.

(10) Patent No.: US 8,440,371 B2
(45) Date of Patent: May 14, 2013

(54) IMAGING DEVICES, METHODS OF FORMING SAME, AND METHODS OF FORMING SEMICONDUCTOR DEVICE STRUCTURES

(75) Inventors: Yuan He, Boise, ID (US); Kaveri Jain, Boise, ID (US); Lijing Gou, Boise, ID (US); Zishu Zhang, Boise, ID (US); Anton J. DeVilliers, Boise, ID (US); Michael Hyatt, Boise, ID (US); Jianming Zhou, Boise, ID (US); Scott Light, Boise, ID (US); Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 12/986,836

(22) Filed: Jan. 7, 2011

(65) Prior Publication Data

US 2012/0178026 A1     Jul. 12, 2012

(51) Int. Cl.
*G03F 1/36* (2012.01)
(52) U.S. Cl.
USPC .................................................... 430/5
(58) Field of Classification Search ............. 430/5, 290, 430/321
See application file for complete search history.

(56) References Cited

U.S. PATENT DOCUMENTS

| | | | |
|---|---|---|---|
| 6,274,281 B1 | 8/2001 | Chen | |
| 6,638,664 B2 | 10/2003 | Hsieh et al. | |
| 6,787,274 B2 | 9/2004 | Park | |
| 6,977,715 B2 | 12/2005 | Wu | |
| 7,052,808 B2 | 5/2006 | Liu et al. | |
| 7,435,512 B2 | 10/2008 | Chang | |
| 7,736,819 B2* | 6/2010 | Zait et al. | 430/5 |
| 2004/0197674 A1* | 10/2004 | Bailey et al. | 430/5 |
| 2006/0240359 A1 | 10/2006 | Liu | |
| 2009/0012769 A1 | 1/2009 | Wang et al. | |
| 2010/0209824 A1 | 8/2010 | Park | |

OTHER PUBLICATIONS

International Search Report, International Application No. PCT/US2011/066745, mailed Sep. 12, 2012, three (3) pages.
Written Opinion of the International Searching Authority, International Application No. PCT/US2011/066745, mailed Sep. 12, 2012, five (5) pages.

* cited by examiner

*Primary Examiner* — Stephen Rosasco
(74) *Attorney, Agent, or Firm* — TraskBritt

(57) ABSTRACT

An imaging device comprising at least one array pattern region and at least one attenuation region. A plurality of imaging features in the at least one array pattern region and a plurality of assist features in the at least one attenuation region are substantially the same size as one another and are formed substantially on pitch. Methods of forming an imaging device and methods of forming a semiconductor device structure are also disclosed.

24 Claims, 5 Drawing Sheets

IMAGING DEVICES, METHODS OF FORMING SAME, AND METHODS OF FORMING SEMICONDUCTOR DEVICE STRUCTURES

TECHNICAL FIELD

Embodiments of the present disclosure relate to photolithographic processes and, more specifically, to improving photolithographic processes utilizing imaging devices having array features and assist features of substantially the same size and formed substantially on pitch, methods of forming such imaging devices, and method of forming semiconductor device structures utilizing the imaging devices.

BACKGROUND

Reticles are often used to form patterns on integrated circuit wafers. As pattern dimensions decrease, critical dimension (CD) proximity effect becomes a significant problem and methods to correct for the proximity effect problems are used. Optical proximity correction (OPC) is a method of eliminating deviations in the critical dimensions of a device due to a proximity effect. The proximity effect occurs when radiation, such as light, is projected onto a reticle having a pattern thereon. Due to diffraction of the radiation by the reticle, which may also be characterized as scattering, the radiation diverges and spreads. The diffracted light creates multiple diffraction orders, not all of which are captured by a lens of an optics system. The lens captures a portion of the light, which is directed to a surface of a semiconductor substrate. In addition, a portion of the radiation passing through a photoresist material on the semiconductor substrate is reflected by the surface of the underlying semiconductor substrate, causing light interference and leading to overexposure of the photoresist material in part of the pattern, which causes defects, such as optical distortions (i.e., rounding), in the photoresist material. While OPC methods are used to correct for these defects, conventional OPC methods are complicated because computer software must be utilized to calculate where the optical distortions are likely to occur. Conventional OPC methods also rely on empirical data. However, empirical-based solutions to OPC require protracted time, and many mask iterations, in order to be successfully developed.

Assist features, such as serif features, hammerhead features, and outrigger features, are also used in conventional OPC methods. The assist features are formed at sub-resolution scale relative to the patterns on the reticle, which correspond to the features to be formed on the semiconductor substrate. While conventional assist features are not imaged (e.g., printed) on the semiconductor substrate, these assist features cause additional diffraction and scattering of the radiation due to the production of diffractive signals that may be at a high angle of attack and go through edges of a lens in the optics system. The conventional assist features are sensitive to aberrations since they enable imaging of the features on the semiconductor substrate but do not, themselves, participate in the imaging. Use of such assist features in conventional OPC methods causes problems in CD uniformity (CDU) and CD bias control in both production and simulation/modeling.

It would be desirable to achieve a photolithography process having fewer mask manufacturing problems, imaging quality problems, CD, and CDU problems.

DETAILED DESCRIPTION

Figure 1:
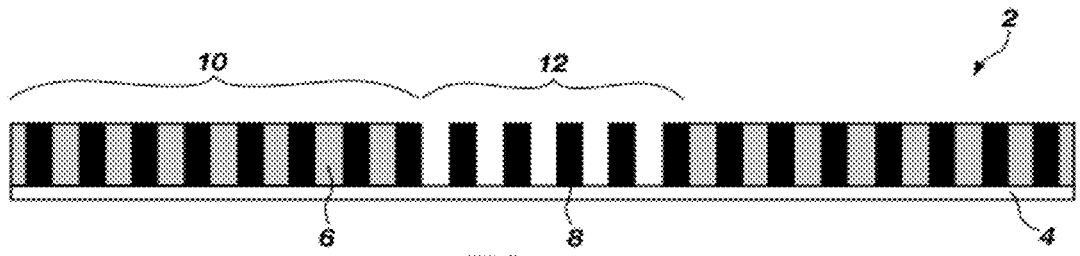
FIGS. 1-3 are top down views of imaging devices according to embodiments of the present disclosure.

Imaging devices (e.g., photomasks, such as reticles) for forming semiconductor device structures are disclosed, as are methods of forming the imaging devices and methods of forming semiconductor device structures. The imaging device may include at least one array pattern region and at least one attenuation region on a substrate. The at least one array pattern region may include imaging features that correspond to array features ultimately to be formed on the semiconductor device structure. In one embodiment, the at least one attenuation region may include assist features that are configured to at least significantly attenuate (e.g., block) radiation such that corresponding features are not formed on the semiconductor device structure. In another embodiment, the at least one attenuation region may include assist features and at least one pixilated structure that are configured to at least significantly attenuate (e.g., block) radiation such that corresponding features are not formed on the semiconductor device structure. The array features on the semiconductor device structure are often desirably substantially the same size as one another and formed substantially on pitch. Therefore, the imaging features in the array pattern regions are also substantially the same size as one another and substantially formed on pitch. The assist features in the attenuation region are substantially the same feature size as one another and substantially the same feature size and pitch as the imaging features. The periodicity of the imaging features and the assist features may provide good CD and CDU to the array features ultimately formed on the semiconductor device structures.

The imaging devices of the present disclosure enable the transmittance of different amounts of radiation through different regions of the imaging device. Since the periodicity of the assist features may be maintained at a constant (e.g., uniform) pitch across the attenuation region, the array pattern regions may be easier to image. Therefore, an optics system in a photolithography process utilizing the imaging devices may view the imaging features (in the array pattern regions) and the assist features (in the attenuation region) as a gray scale and as a uniform field. By forming the imaging features and the assist features at substantially the same size and pitch, diffraction consistency across the array and periphery is improved. In addition, the image quality of the imaging features and, thus, the image quality of the array features may be maintained. By utilizing the imaging devices and methods of the present disclosure, imaging may be fundamentally improved, such as imaging employed in the fabrication of flash memory.

The following description provides specific details, such as material types, material thicknesses, and patterns in the imaging devices in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form the complete semiconductor device from the semiconductor device structures may be performed by conventional fabrication techniques.

The materials described herein may be formed by any suitable technique including, but not limited to, spin coating, blanket coating, chemical vapor deposition (CVD), atomic layer deposition (ALD), plasma enhanced ALD, or physical vapor deposition (PVD), unless otherwise specified. Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

The illustrations presented herein are not meant to be actual views of any particular semiconductor device structure, but are merely idealized representations that are employed to describe the present disclosure. The figures are not necessarily drawn to scale. Additionally, elements common between figures may retain the same numerical designation.

A desired pattern of array features to be formed on the semiconductor device structure may be achieved by enabling the transmission of different amounts, which may also be characterized as magnitudes (i.e., intensities), of the radiation to pass through the imaging device. By way of example, the array pattern regions of the imaging device may enable the transmission of a higher percentage of the radiation therethrough to form the array features on the semiconductor device structure, while the attenuation regions may enable the transmission of a lower percentage of the radiation therethrough. Therefore, features corresponding to the assist features located in the attenuation regions may not be formed on the semiconductor device structure. The assist features may be formed from a radiation attenuating material such that an attenuated amount of radiation passes through the attenuation regions of the imaging device. The radiation attenuating material may be selected to provide a desired degree and phase of attenuation of the radiation. The array features to be formed on the semiconductor device structure may be dense features, isolated features, or combinations thereof. As used herein, the terms "dense feature" and "isolated feature" refer to the relative proximity of individual features to one another on the semiconductor device structure. The dense features may be in close proximity to one another on the semiconductor device structure while the isolated features may be spaced farther apart from one another. The semiconductor device structure may also include a region in which the dense features transition into the isolated features. For convenience, such a transition region is referred to herein as a so-called "iso-dense region." The iso-dense region is a portion of the semiconductor device structure that transitions from array features to assist features. The array features may be substantially one-dimensional features in the major plane of the semiconductor device structure, such as conductive lines, such as access lines (i.e., wordlines), or two-dimensional features, such as contacts.

The method of the present disclosure may utilize the imaging device having the at least one array pattern region and the at least one attenuation region to form the desired pattern on the semiconductor device structure. As shown in FIG. 1, the imaging device 2 may include a substrate 4 having assist features 6 formed thereon that are configured to at least partially attenuate radiation that passes therethrough. Other imaging devices 2', 2", 2''', 2'''' are shown in FIGS. 2A, 2B, 3, and 13. The assist features 6 may, for example, be configured to substantially block radiation that passes through the imaging device 2', 2", 2''', 2''''. The assist features 6 may be formed from an optically opaque material that attenuates the radiation. As used herein, the term "optically opaque," or grammatical equivalents thereof, means and includes a material that is configured to intercept (e.g., absorb) the radiation to which the imaging device 2, 2', 2", 2''', 2'''' is exposed. The imaging device 2, 2', 2", 2''', 2'''' may also include imaging features 8, which are formed from an optically opaque material or a partially transmissive material. As used herein, the term "partially transmissive material," or grammatical equivalents thereof, means and includes a material through which a portion of the radiation of a selected wavelength or wavelength range passes when the imaging device 2, 2', 2", 2''', 2'''' is exposed to such radiation, for example, during a photolithographic process. By way of example, the partially transmissive material may include, but is not limited to, molybdenum silicon (MoSi), molybdenum-doped silicon oxide ($MoSi_xO_y$), molybdenum-doped silicon oxynitride ($MoSi_xO_yN_z$), molybdenum-doped silicon nitride, molybdenum silicide, chromium oxide (CrO), tantalum silicon oxynitride (TaSiON), or combinations thereof, wherein "x," "y" and "z" are numbers greater than zero. The partially transmissive material may enable approximately 6%, approximately 20%, approximately 30%, or approximately 40% of the radiation to pass therethrough, depending on the material selected. Partially transmissive materials that enable 6% or 20% of the radiation to pass therethrough are known in the art. The imaging features 8 may be 180° out of phase with open areas on the imaging device 2 and the assist features 6. As previously described, the assist features 6 may form attenuation region 10 and the imaging features 8 may form array pattern region 12. The substrate 4 may be formed from a material that is optically transparent to a wavelength or range of wavelengths of radiation to which the imaging device 2, 2', 2", 2''', 2'''' is to be exposed. As used herein, the term "optically transparent," or grammatical equivalents thereof, means and includes a material through which substantially all radiation of a selected wavelength or wavelength range passes when the imaging device 2, 2', 2", 2''', 2'''' is exposed to such radiation, for example, during a photolithographic process. By way of example, the optically transparent material may be quartz. In FIGS. 1-3 and 13, the regions of the imaging device

2, 2', 2", 2''', 2'''' through which radiation passes (those formed of the optically transparent material) are indicated in white, the regions of the imaging device 2, 2', 2", 2''', 2'''' through which radiation is substantially blocked (those formed of the optically opaque material) are indicated in black, and the regions of the imaging device 2, 2', 2", 2''', 2'''' through which radiation is at least partially blocked are indicated in gray (the assist features 6, a pixelated structure 14, or imaging features 8).

In some embodiments of the imaging device 2, 2', 2", 2''', 2'''', the assist features 6 at least partially attenuate radiation by forming the assist features 6 from a material formulated, at the thickness of the assist features 6, to partially attenuate the radiation. The radiation attenuating material may be selected based on its extinction coefficient (k) to achieve a desired percentage of attenuation (partial transmissivity) of the radiation. The radiation attenuating material may block a known percentage of radiation of a particular wavelength or wavelength range from passing through the attenuation regions 10 while permitting a remainder of the radiation to pass therethrough. The radiation attenuating material may be MoSi, $MoSi_xO_y$, $MoSi_xO_yN_z$, molybdenum-doped silicon nitride, molybdenum silicide, CrO, TaSiON, or combinations thereof, wherein "x," "y" and "z" are numbers greater than zero. In one embodiment, the radiation attenuating material is MoSi. By way of example, the radiation attenuating material may be a MoSi that in configured to block 6% of the radiation or to block 20% of the radiation. The radiation attenuating material may be formed on the substrate 4 by conventional techniques, such as by chemical vapor deposition (CVD) or physical vapor deposition (PVD). The assist features 6 may be formed from the radiation attenuating material by patterning the radiation attenuating material, such as by using conventional photolithography techniques, which are not described in detail herein. The thickness of the radiation attenuating material for effective attenuation of radiation may depend on the wavelength or range of wavelengths of radiation to which the imaging device 2, 2', 2", 2''', 2'''' are to be exposed and on the desired degree of transmissivity of radiation through the imaging device 2, 2', 2", 2''', 2''''. By way of non-limiting example, the thickness of the radiation attenuating material may be from approximately 50 nm to approximately 200 nm if a wavelength of from approximately 193 nm to approximately 248 nm is to be used as the radiation.

Figure 2A:
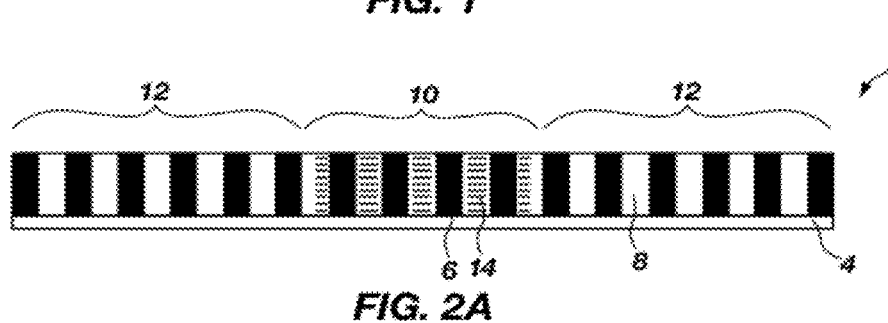
Figure 2B:
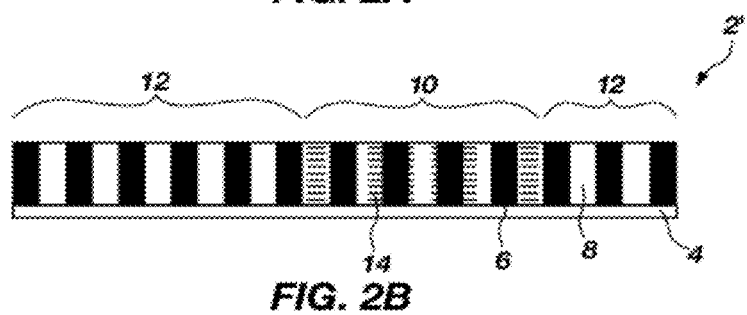

In another embodiment of the imaging device 2', 2", the attenuation region 10 includes at least one pixelated structure 14 formed from a material that is optically opaque to, absorptive (e.g., non-transmissive) of, or partially transmissive of the wavelength or range of wavelengths of radiation to which the imaging device 2', 2" is exposed, as shown in FIGS. 2A and 2B. The pixelated structure 14 may be formed of a plurality of so-called "dots" of the optically opaque material, which appear like a gray scale to the optics system used in the photolithography process. The dots of the pixelated structure 14 may be formed on a sub-resolution scale such that the size of the dots of the pixelated structure 14 may be smaller than the resolution of the optics system used in the photolithography process. The assist features 6, in combination with the pixelated structures 14, may control the transmission of radiation in the attenuation region 10 of the imaging device 2', 2". By way of example, the optically opaque material may be a metal material, such as chromium (Cr), a chromium-containing compound, titanium nitride, tungsten, or combinations thereof. The assist features 6 and pixelated structure 14 may be formed of the same material as the imaging features 8. In one embodiment, the assist features 6 and pixelated structure 14 are formed from chrome. The optically opaque material may be formed at a thickness of from approximately 400 Å to approximately 800 Å. The optically opaque material may be formed on the substrate 4 by conventional techniques, such as by CVD or PVD, depending on the material used. The assist features 6 and pixelated structure 14 may be formed from the optically opaque material by patterning the optically opaque material, such as by using conventional photomask writing techniques, which are not described in detail herein. By way of example, the optically opaque material may be patterned using an e-beam writer or a laser-based exposure tool.

The assist features 6 in FIGS. 2A and 2B may be formed on pitch relative to the imaging features 8 of the array pattern region 12. However, the pixelated structures 14 may be formed off pitch relative to the assist features 6 and the imaging features 8. The patterned optically opaque material in the attenuation regions 10 may form the pixelated structures 14 and assist features 6, as shown in FIGS. 2A and 2B. The pixelated structures 14 may be located between individual assist features 6, positioned proximate to the assist features 6, as shown in FIG. 2A, or in contact with the assist features 6, as shown in FIG. 2B. When the imaging devices 2', 2" are exposed to radiation, the pixelated structures 14 and the assist features 6 may prevent the radiation from passing through the attenuation regions 10. The pitch of the pixelated structures 14 may cause the optics system to view the pixelated structures 14 as a uniform attenuating field. Due to the diffraction of the radiation by the assist features 6 and the pixelated structures 14, the radiation may fall outside the region to be captured by the lens of the optics system. The energy of the radiation is below a threshold level ($E_0$), causing the optic system to view the pixelated structures 14 as a uniform attenuating field. Consequently, the assist features 6 and pixelated structures 14 may not be formed (e.g., printed) on the semiconductor device structure while the array features are formed thereon.

Figure 3:
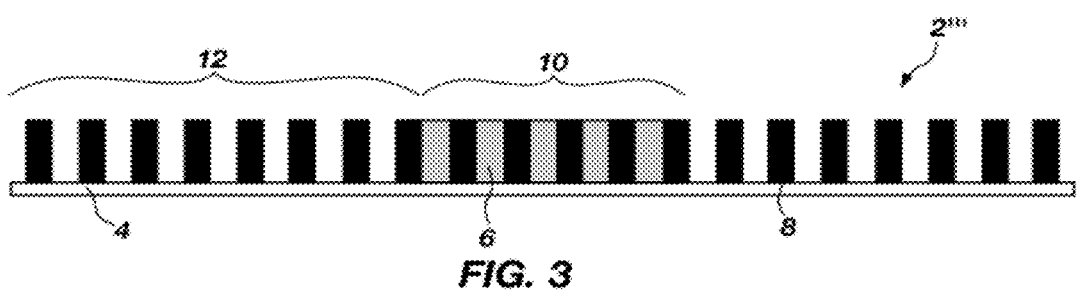

In other embodiments, imaging devices 2, 2''' may be formed in which the relative sizes of the array pattern regions 12 and the attenuation regions 10 differ. By way of example, the array pattern regions 12 may be larger in size than the attenuation regions 10, or the array pattern regions 12 may be smaller in size than the attenuation regions 10, as shown by a comparison of these regions in FIGS. 1 and 3. In one embodiment, the array pattern region 12, which corresponds to the pattern to be formed on the semiconductor device structure, may be smaller relative to the attenuation regions 10 of the imaging device 2, as shown in FIG. 1. Since the attenuation regions 10 are a large scale feature, the attenuation regions 10 may provide attenuation of the radiation on a large scale. In addition, due to the relatively large area of the attenuation regions 10, the method of the present disclosure may be easier to implement than conventional OPC methods. In another embodiment, the array pattern regions 12 of the imaging device 2''' may be larger relative to the attenuation regions 10, as shown in FIG. 3. However, in both embodiments, the array pattern regions 12 and the attenuation regions 10 may include features (assist features 6 and imaging features 8) that are substantially on pitch. Therefore, in contrast to conventional assist features, which are smaller in size and are subject to aberration sensitivity, the attenuation regions 10 of the imaging devices 2, 2''' of the present disclosure may have substantially reduced aberration sensitivity.

The imaging devices 2, 2', 2", 2''' shown in FIGS. 1-3 may be used to form array features on the semiconductor device structure, such as patterns of lines and spaces. In addition, imaging devices similar to the imaging devices 2, 2', 2", 2''' may be used to form different patterns on the semiconductor device structure. To form the patterns, which are described in more detail below, the imaging devices 2, 2', 2'', 2''' may be positioned over the substrate 4 having a photoresist material (not shown) thereover. The photoresist material may be a conventional material used in a photolithography process and, therefore, is not described in detail herein. As used herein, the term "substrate" means and includes a conventional silicon substrate or other bulk substrate having a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The substrate 4 may, optionally, include other materials (not shown) thereon, such as materials from previous acts conducted during the fabrication of the semiconductor device structure. The substrate 4 and the photoresist material may form an intermediate semiconductor device structure upon which the array features are to be formed. For simplicity, neither the photoresist material nor the underlying materials, if present, are illustrated in the drawings.

The radiation of the desired wavelength or range of wavelengths may be directed at the photoresist material of the intermediate semiconductor device structure through each of the imaging devices 2, 2', 2'', 2'''. As the radiation passes through each of the imaging devices 2, 2', 2'', 2''', the array pattern regions 12 and the attenuation regions 10 of the imaging devices 2, 2', 2'', 2''' may cause the radiation to be transmitted differently therethrough, enabling the pattern on each of the imaging devices 2, 2', 2'', 2''' to be transferred to the photoresist material overlying the substrate 4. If the intensity of the radiation reaching the photoresist material is greater than a threshold level ($E_0$), the photoresist material may be cured by the radiation and subsequently developed and removed, producing a pattern in the photoresist material that corresponds to the pattern in the imaging devices 2, 2', 2'', 2'''. While various embodiments herein describe the photoresist material as a positive-tone photoresist and the development thereof as a positive-tone development process, the photoresist material may also be a negative-tone photoresist that is developed using a positive-tone development process (e.g., TMAH), or a positive-tone photoresist that is developed using a negative-tone development process (e.g., a solvent for unexposed regions). By way of example, the radiation may be transmitted through the array pattern regions 12 (the radiation passing therethrough is greater than $E_0$) and at least partially attenuated or substantially blocked by the attenuation regions 10 (the radiation passing therethrough is less than $E_0$), depending on the material used to form the assist features 6 or pixelated structures 14 in the attenuation region 10. Following development, the patterned photoresist material may be used as a mask to pattern underlying materials, such as the substrate 4, producing the array features on a top surface of the substrate 4.

The imaging devices 2, 2', 2'', 2''' and methods of the present disclosure may be used in a photolithography process to form the array features on the substrate 4, where the array features are at a uniform pitch. The array features may be dense or isolated. By way of example, the array features may be patterns of lines and spaces, such as a pattern of conductive lines, such as access lines (i.e., wordlines), such as for flash memory. The imaging devices 2'''' and methods of the present disclosure may also be used to form two-dimensional patterns of interest so long as the array features to be formed are substantially on pitch and are of substantially the same size. Various examples of patterns to be formed using the imaging devices 2, 2', 2'', 2''' and methods of the present disclosure are described in more detail below. For simplicity, each of FIGS. 4 and 8 illustrate a top surface of semiconductor device structures 16, 16' that may be formed using the imaging devices 2, 2', 2'', 2'''.

Figure 4:
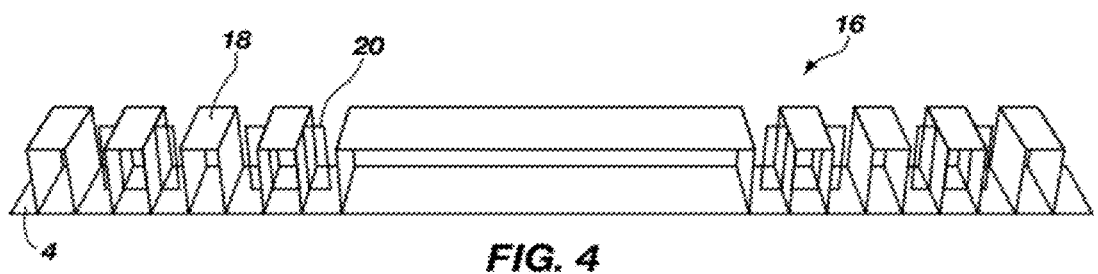
FIG. 4 is a side view of a pattern formed on a semiconductor device structure according to an embodiment of the present disclosure.
Figure 5:
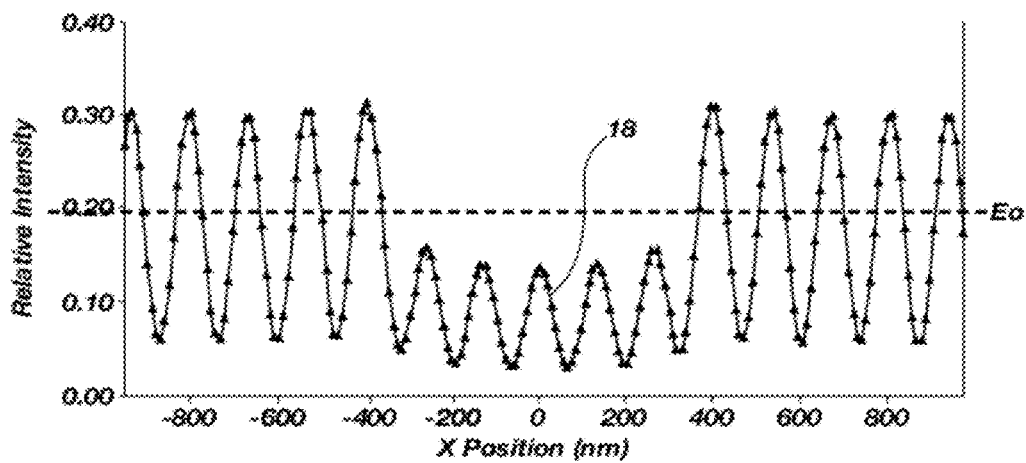
FIG. 5 is a simulated, dose-to-clear curve (relative intensity of radiation as a function of photoresist thickness) generated using the imaging device of FIG. 3.
Figure 6:
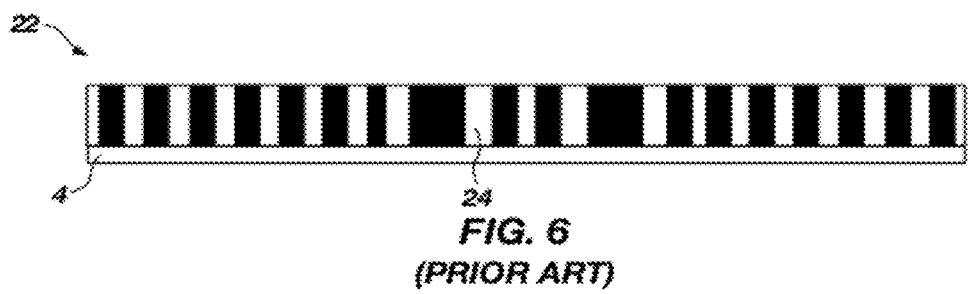
FIG. 6 is a top down view of an imaging device of the prior art.
Figure 7:
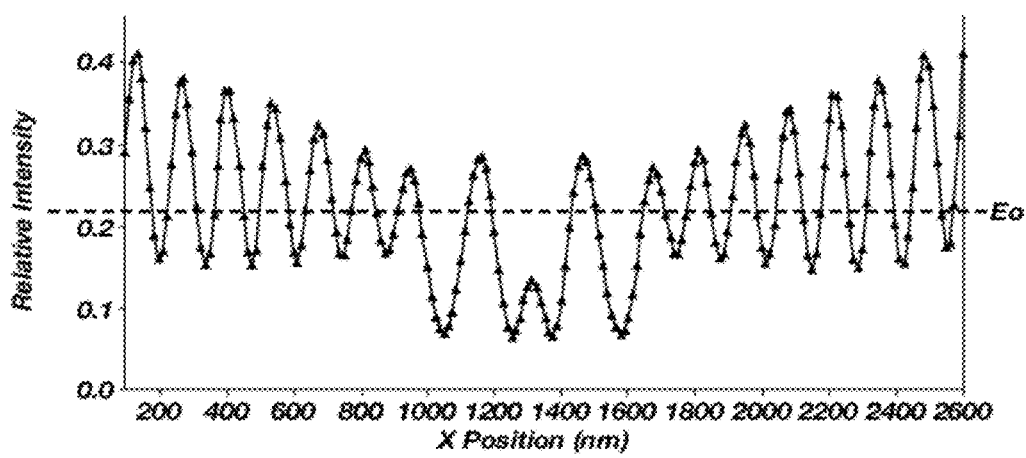
FIG. 7 is a simulated dose-to-clear curve (relative intensity of radiation as a function of photoresist thickness) generated using the imaging device of FIG. 6.

FIG. 4 illustrates a semiconductor device structure 16 having a pattern of lines 18 and spaces 20 that is formed utilizing the imaging device 2''' of FIG. 3. By way of example, this pattern may be used to produce a conductive line (i.e., access line, such as a word line) in a Not-and (NAND) flash memory device. As shown in FIG. 5, a simulation of an aerial image plot (the relative intensity of radiation utilized to completely remove the photoresist material overlying the substrate 4 as a function of position on the substrate 4) indicates that uniform lines 18 may be formed (e.g., printed). The intensity threshold is a parameter of the photoresist material and defines the amount of radiation required to induce a sufficient change in the chemical properties of the photoresist material so that the photoresist material may be fully developed. As previously described, the photoresist material may be a positive-tone or a negative-tone and may be developed by a positive-tone development process or a negative-tone development process. Simulation tools for photolithography are known in the art, such as the PROLITH™ system, which is commercially available from KLA-Tencor Corp. (Milpitas, Calif.). As evidenced by FIG. 5, the lines 18 may exhibit a good CDU and contrast. In addition, the normalized image log slope (NILS) and CD may be uniform (e.g., do not change) along the lines 18. Therefore, use of the imaging device 2''' should enable simplified control of the CDU of the array features and no additional OPC may be needed. However, if additional correction is needed, the methods of the present disclosure may be used in combination with conventional OPC methods. In contrast, in a conventional OPC method using an imaging device 22 as shown in FIG. 6, which has features 24 of different size and that are not formed on pitch, the aerial image plot (FIG. 7) indicates that the lines are not uniformly formed and that the NILS and CD change along the lines.

Figure 8:
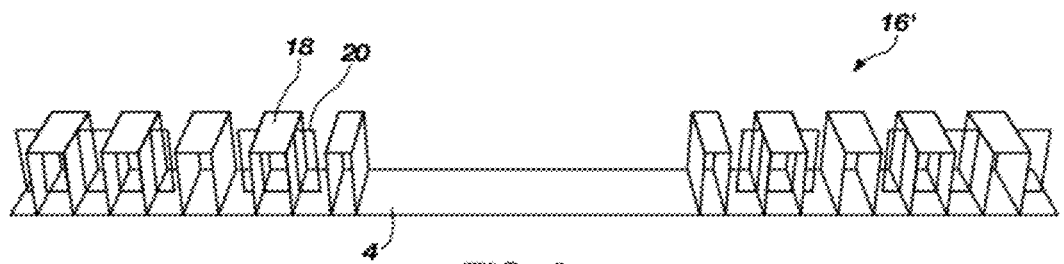
FIG. 8 is a side view of a pattern formed on a semiconductor device structure according to an embodiment of the present disclosure.
Figure 9:
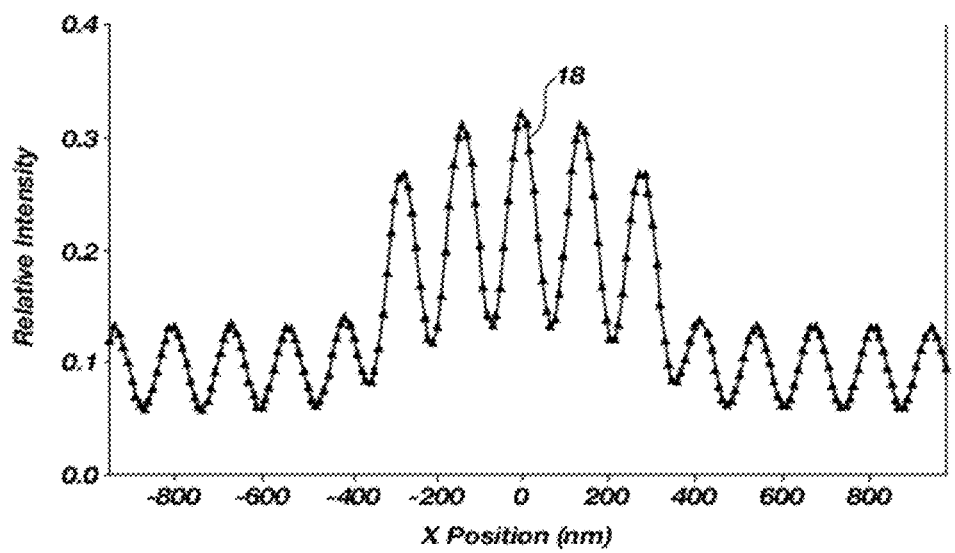
FIG. 9 is a simulated dose-to-clear curve (relative intensity of radiation as a function of photoresist thickness) generated using the imaging device of FIG. 1.
Figure 10:
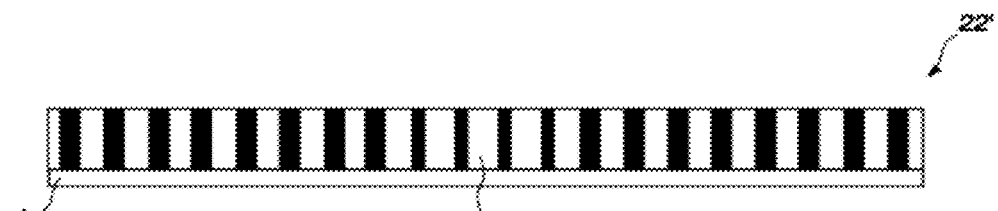
FIG. 10 is a top down view of an imaging device of the prior art.
Figure 11:
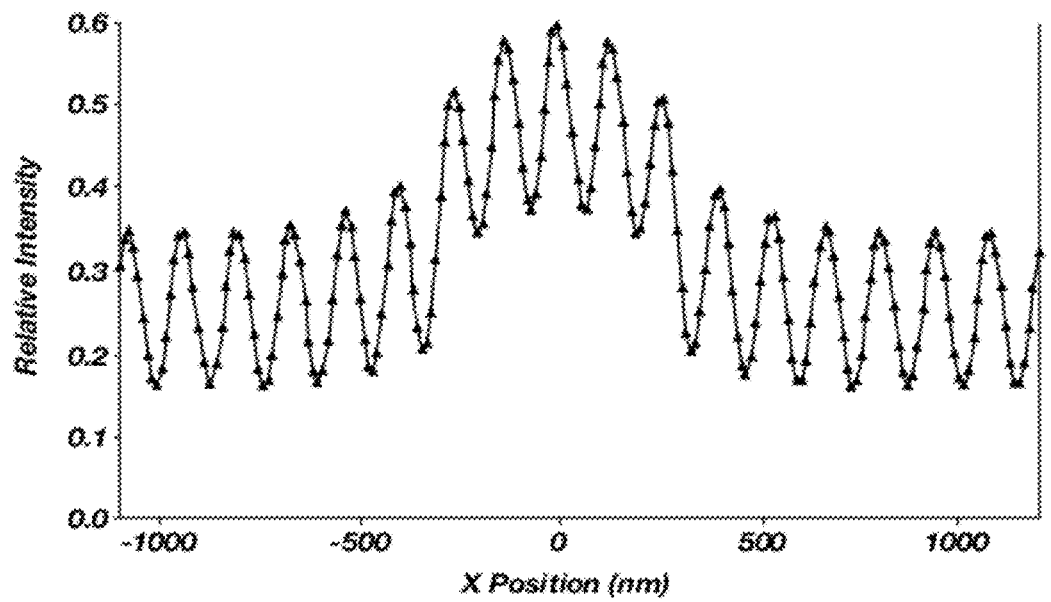
FIG. 11 is a simulated dose-to-clear curve (relative intensity of radiation as a function of photoresist thickness) generated using the imaging device of FIG. 10.

FIG. 8 illustrates a semiconductor device structure 16' having a pattern of lines 18 and spaces 20 that is formed utilizing the imaging device 2 of FIG. 1. This pattern may be used to produce a conductive line (e.g., access line, such as a word line) in a NAND flash memory device. As shown in FIG. 9, the aerial image plot indicates that uniform lines 18 may be formed. In contrast, in a conventional OPC method using an imaging device 22' as shown in FIG. 10, which has features 24 of different size, the aerial image plot (FIG. 11) indicates that the lines are not uniformly formed.

Figure 12:
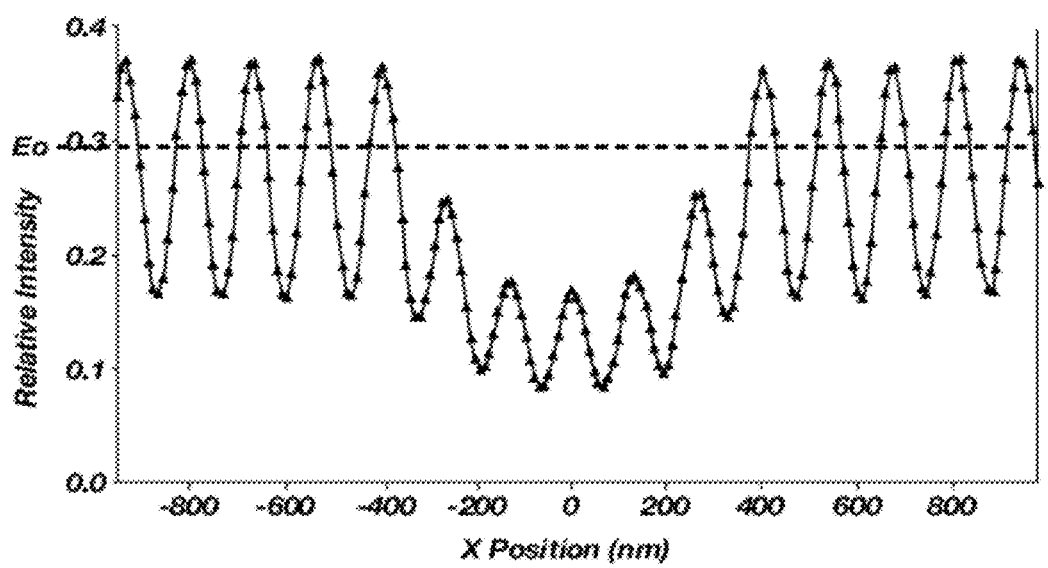
FIG. 12 is a simulated dose-to-clear curve (relative intensity of radiation as a function of photoresist thickness) generated using the imaging device of FIGS. 2A and 2B.

The imaging devices 2', 2'' of FIGS. 2A and 2B, which includes pixelated structures 14, may be used to form the pattern of lines 18 and spaces 20 on the semiconductor device structure 16 shown in FIG. 4. As the dose-to-clear curve in FIG. 12 indicates, uniform lines may be formed when the imaging devices 2', 2'' are utilized. Therefore, no additional OPC may be needed.

Figure 13:
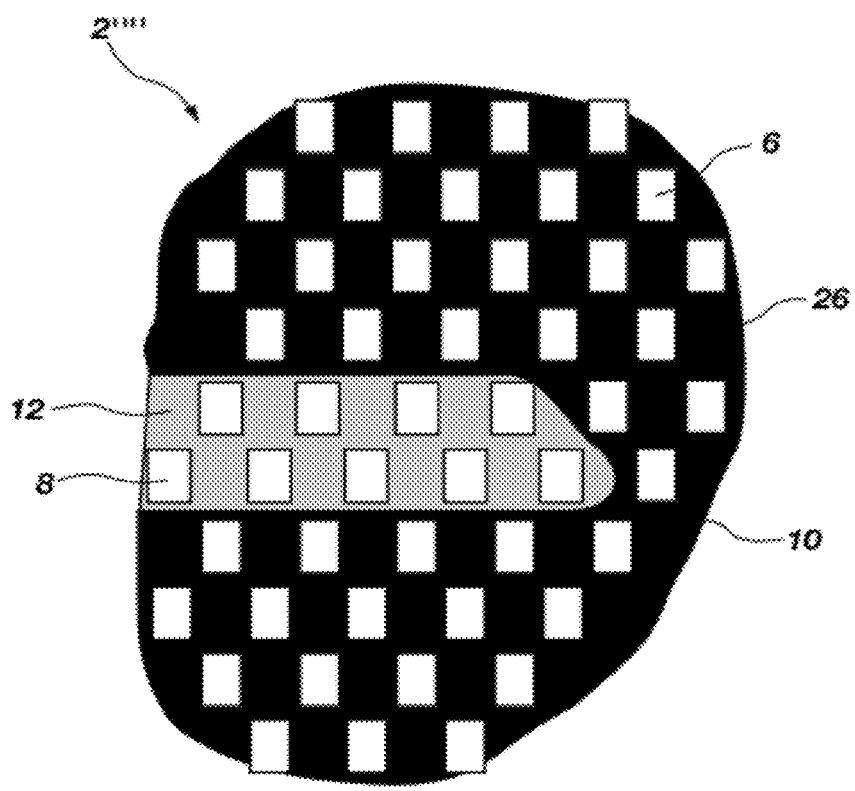
FIGS. 13 and 14 are top down views of imaging devices according to embodiments of the present disclosure.
Figure 14:
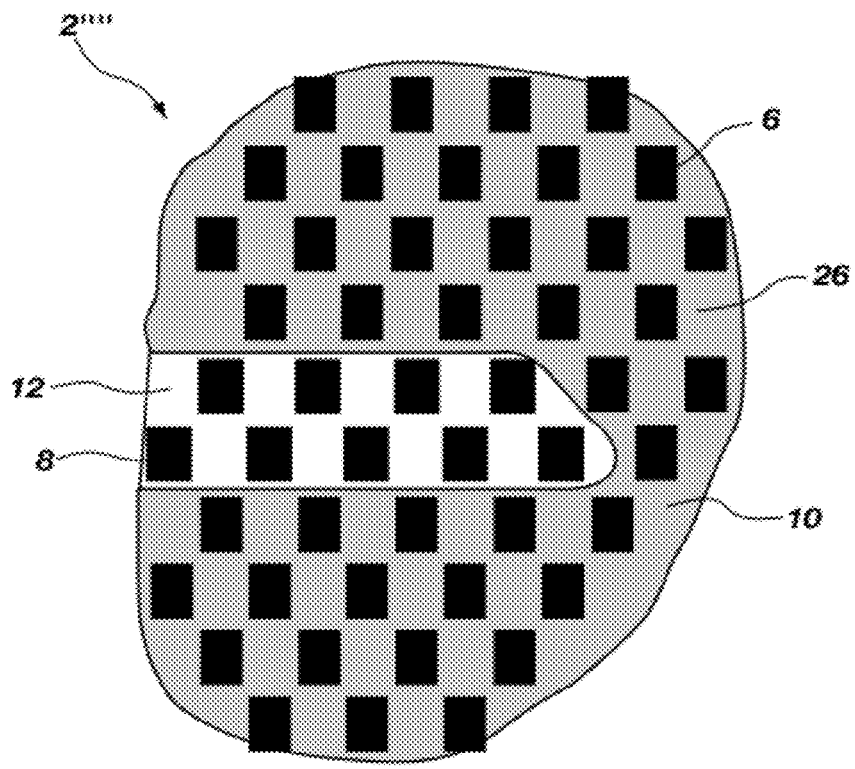

Small isolated features, such as contacts, may also be formed on a semiconductor device structure utilizing imaging device 2'''', as shown in FIGS. 13 and 14. The imaging device 2'''' may include assist features 6 in the attenuation region 10 and imaging features 8 in the array pattern region 12, with the assist features 6 separated from one another by radiation attenuating material 26. The imaging features 8 in the array pattern region 12 may have a pattern corresponding to a pattern of contacts to be formed on the semiconductor device structure. The assist features 6 in the attenuation region 10 and imaging features 8 in the array pattern region 12 may be substantially the same size and formed substantially on pitch.

The total area of the attenuation region 10 may be significantly larger than the total area of the array pattern region 12. Due to the substantially uniform pitch and size of the imaging features 8 and assist features 6, the optics system may view the imaging device 2"" as having a uniform field during photolithography. Although the size and pitch of the assist features 6 in the attenuation region 10 are substantially the same as the imaging features 8 in the array pattern region 12, the assist features 6 are not formed by the optics systems because the radiation attenuating material 26 attenuates the passage of radiation therethrough.

In the embodiment illustrated in FIG. 13, a conventional positive-tone develop process may be used to form the isolated features. The assist features 6 may be formed from a partially transmissive material, the imaging features 8 may be formed from an optically transparent material, such as quartz, the array pattern region 12 may be formed from a partially transmissive material, such as one of the materials previously described, and the radiation attenuating material 26 may be formed from an optically opaque material. Attenuation of the radiation may occur in a region of the imaging device 2"" including the assist features 6. In the embodiment illustrated in FIG. 14, a conventional negative-tone develop process may be used to form the isolated features. The assist features 6 and the imaging features 8 may be formed from an optically opaque material, the array pattern region 12 may be formed from an optically transparent material, such as quartz, and the radiation attenuating material 26 may be formed from a partially transmissive material, such as one of the materials previously described.

The imaging devices 2, 2', 2", 2"', 2"" and methods of the present disclosure previously described may also be used to form semiconductor device structures that include a plurality of dense array features (not shown) and a plurality of isolated array features (not shown). The semiconductor device structure may also include an iso-dense region where the semiconductor device structure transitions from array features to assist features. During formation of such semiconductor device structures by conventional methods, the transition regions typically exhibit problems with CDU, CD bias, and CD asymmetry at edges of the array. However, by utilizing the imaging devices 2, 2', 2", 2"', 2"" and methods of the present disclosure, the problems with CDU, CD bias, and CD asymmetry may be reduced or eliminated.

By utilizing imaging devices 2, 2', 2", 2"', 2"" of the present disclosure in photolithography processes, a single attenuation act may be conducted on a large region of the imaging devices 2, 2', 2", 2"', 2"". Thus, the method of the present disclosure may be easier to implement than conventional OPC methods. The imaging devices 2, 2', 2", 2"', 2"" may also be utilized in conventional photolithography processes with few modifications to existing equipment and hardware. In conventional OPC methods, radiation may fall outside of the lens of the optics system, which results in high aberration sensitivity. However, with the imaging devices 2, 2', 2", 2"', 2"" and methods of the present disclosure, substantially all of the radiation falls within the lens, giving robust aberration performance. Since the assist features 6 are formed at substantially the same feature size and pitch as the imaging features 8, the optics system used in the method of the present disclosure may easily image the assist features 6, enabling low aberration sensitivity. Furthermore, since the assist features 6 are formed in a periodic manner across the attenuation region 10, the assist features 6 may be optically viewed as a uniform field by the optics system. Thus, the assist features 6 of the attenuation regions 10 may participate in imaging even though corresponding features are not formed on the semiconductor device structures 16, 16'. In contrast, in conventional OPC methods, the optics system does not optically recognize the assist features because these assist features are formed at a sub-resolution scale. In the imaging devices 2, 2', 2", 2"', 2"" and methods of the present disclosure, the attenuation regions 10 may be viewed optically as gray scale, in contrast to the array pattern regions 12.

CONCLUSION

An embodiment of the present disclosure includes an imaging device. The imaging device comprises at least one array pattern region and at least one attenuation region. A plurality of imaging features in the at least one array pattern region and a plurality of assist features in the at least one attenuation region are substantially the same size as one another and are formed substantially on pitch.

Another embodiment of the present disclosure includes a method of forming an imaging device. The method comprises forming a plurality of imaging features and a plurality of assist features on a substrate. The plurality of imaging features and the plurality of assist features are substantially the same size as one another and have a substantially uniform pitch.

Yet another embodiment of the present disclosure includes a method of forming a semiconductor device structure that comprises exposing a photoresist material to radiation through an imaging device. The imaging device comprises at least one array pattern region and at least one attenuation region. Features in the at least one array pattern are substantially the same size and formed substantially on the same pitch as features in the at least one attenuation region. Portions of the photoresist material are removed to form a pattern in the photoresist material. The pattern is then transferred to the structure.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. An imaging device, comprising:
   at least one array pattern region comprising a plurality of imaging features and at least one attenuation region comprising a plurality of assist features, the at least one attenuation region configured to inhibit formation of features on a portion of a structure corresponding to the at least one attenuation region;
   wherein the plurality of imaging features and the plurality of assist features are substantially the same size as one another and are substantially on the same pitch.

2. The imaging device of claim 1, wherein the at least one array pattern region comprises a pattern of an optically transparent material and an optically opaque or partially transmissive material.

3. The imaging device of claim 1, wherein the at least one attenuation region comprises the plurality of assist features formed from an optically opaque material or a radiation attenuating material.

4. The imaging device of claim 1, wherein a total area of the at least one array pattern region is larger than a total area of the at least one attenuation region.

5. The imaging device of claim 1, wherein a total area of the at least one attenuation region is larger than a total area of the at least one array pattern region.

6. The imaging device of claim 1, further comprising at least one pixelated structure.

7. The imaging device of claim 6, wherein a pixelated structure of the at least one pixelated structure contacts an imaging feature of the plurality of imaging features.

8. The imaging device of claim 6, wherein a pixelated structure of the at least one pixelated structure is positioned proximate an imaging feature of the plurality of imaging features.

9. A method of forming an imaging device, comprising:
forming an array pattern region comprising a plurality of imaging features and an attenuation region comprising a plurality of assist features on a substrate, the attenuation region configured to inhibit formation of features on a portion of a structure corresponding to the attenuation region;
wherein the plurality of imaging features and the plurality of assist features are formed to be of substantially the same size as one another and substantially on the same pitch.

10. The method of claim 9, wherein forming an array pattern region comprising a plurality of imaging features and an attenuation region comprising a plurality of assist features on a substrate comprises forming the plurality of imaging features from an optically opaque material or a partially transmissive material.

11. The method of claim 9, wherein forming an array pattern region comprising a plurality of imaging features and an attenuation region comprising a plurality of assist features on a substrate comprises forming the plurality of assist features from an optically opaque material.

12. The method of claim 9, wherein forming an array pattern region comprising a plurality of imaging features and an attenuation region comprising a plurality of assist features on a substrate comprises forming the plurality of assist features from a radiation attenuating material.

13. The method of claim 9, further comprising forming a plurality of pixelated structures on the substrate.

14. The method of claim 13, wherein forming a plurality of pixelated structures on the substrate comprises forming each pixelated structure of the plurality of pixelated structures between adjacent assist features of the plurality of assist features.

15. The method of claim 13, wherein forming a plurality of pixelated structures on the substrate comprises forming each pixelated structure of the plurality of pixelated structures in contact with a respective assist feature of the plurality of assist features.

16. A method of forming a semiconductor device structure, comprising:
exposing a photoresist material to radiation through an imaging device, the imaging device comprising:
at least one array pattern region and at least one attenuation region, the at least one attenuation region configured to inhibit formation of features on a portion of a structure corresponding to the at least one attenuation region, wherein imaging features in the at least one array pattern region are substantially the same size and substantially on the same pitch as assist features in the at least one attenuation region;
removing portions of the photoresist material to form a pattern in the photoresist material; and
transferring the pattern in the photoresist material to the structure.

17. The method of claim 16, wherein removing portions of the photoresist material to form a pattern in the photoresist material comprises removing portions of the photoresist material exposed to radiation above a threshold level.

18. The method of claim 16, wherein removing portions of the photoresist material to form a pattern in the photoresist material comprises removing portions of the photoresist material not exposed to radiation.

19. The method of claim 16, wherein exposing a photoresist material to radiation through an imaging device comprises exposing the photoresist material to different amounts of radiation through the at least one array pattern region and through the at least one attenuation region.

20. The method of claim 16, wherein exposing a photoresist material to radiation through an imaging device comprises exposing the photoresist material to a higher percentage of the radiation through the at least one array pattern region and to a lower percentage of the radiation through the at least one attenuation region.

21. The method of claim 16, wherein transferring the pattern in the photoresist material to the structure comprises forming array features without forming additional features corresponding to the features of the at least one attenuation region.

22. The method of claim 16, wherein the imaging device further comprises at least one pixelated structure.

23. The method of claim 16, wherein transferring the pattern in the photoresist material to the structure comprises forming a pattern of lines and spaces.

24. The method of claim 16, wherein transferring the pattern in the photoresist material to the structure comprises forming contacts.

* * * * *